US009379663B1

(12) United States Patent
Kundu et al.

(10) Patent No.: US 9,379,663 B1
(45) Date of Patent: Jun. 28, 2016

(54) LC OSCILLATOR CIRCUIT WITH WIDE TUNING RANGE

(71) Applicant: Xilinx, Inc., San Jose, CA (US)

(72) Inventors: Somnath Kundu, Minneapolis, MN (US); Vassili Kireev, San Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 14/665,201

(22) Filed: Mar. 23, 2015

(51) Int. Cl.
*H03B 5/12* (2006.01)

(52) U.S. Cl.
CPC .................................... *H03B 5/1212* (2013.01)

(58) Field of Classification Search
CPC .. H03B 5/1225; H03B 5/1265; H03B 5/1271; H03B 5/1287; H03B 5/1296
USPC ............... 331/48, 117 FE, 167, 179
See application file for complete search history.

(56) References Cited

U.S. PATENT DOCUMENTS

| 6,870,432 | B2 * | 3/2005 | Li | H03B 27/00 331/117 FE |
|---|---|---|---|---|
| 2006/0097801 | A1 * | 5/2006 | Adan | H03B 27/00 331/46 |
| 2012/0212300 | A1 * | 8/2012 | Tang | H03B 5/1228 331/117 FE |
| 2013/0296217 | A1 | 11/2013 | Afshari et al. | |

OTHER PUBLICATIONS

Kossel, Marcel et al., "LC PLL with 1.2-Octave Locking Range Based on Mutual-Inductance Switching in 45-nm SOI CMOS," *IEEE Journal of Solid-State Circuits*, Feb. 2009, pp. 436-449, vol. 44, No. 2, IEEE, Piscataway, New Jersey, USA.
Li, Guansheng et al., "A Low-Phase-Noise Wide-Tuning-Rang Oscillator Based on Resonant Mode Switching," *IEEE Journal of Solid-State Circuits*, Jun. 2012, pp. 1295-1308, vol. 47, No. 6, IEEE, Piscataway, New Jersey, USA.
Yin, Jun et al., "A 57.5-90.1-GHz Magnetically Tuned Multimode CMOS VCO," *IEEE Journal of Solid-State Circuits*, Aug. 2013, pp. 1851-1861, vol. 48, No. 8, IEEE, Piscataway, New Jersey, USA.
Sadhu, Bodhisatwa et al., "A CMOS 3.3-8.4 GHz Wide Tuning Range, Low Phase Noise LC VCO," *Proc of the IEEE 2009 Custom Integrated Circuits Conference*, Sep. 13, 2009, pp. 559-562, IEEE, Piscataway, New Jersey, USA.

* cited by examiner

*Primary Examiner* — Joseph Chang
(74) *Attorney, Agent, or Firm* — Robert M. Brush

(57) ABSTRACT

In one example, an oscillator circuit includes: a master oscillator comprising a master LC tank coupled to a master active circuit, the master LC tank including a primary winding of a transformer and a capacitance; a slave oscillator comprising a slave LC tank coupled to a slave active circuit, the slave LC tank including a secondary winding of the transformer and a capacitance; and a first pair of coupling transistors and a second pair of coupling transistors each coupling the master oscillator to the slave oscillator. Gates of the first pair of coupling transistors are coupled to the master oscillator through a switch. Gates of the second pair of coupling transistors are coupled to the master oscillator through respective ninety-degree phase shifters and the switch.

20 Claims, 8 Drawing Sheets

LC OSCILLATOR CIRCUIT WITH WIDE TUNING RANGE

TECHNICAL FIELD

Examples of the present disclosure generally relate to electronic circuits and, in particular, to an LC oscillator circuit with a wide tuning range.

BACKGROUND

Inductance-capacitance (LC) oscillators can be used in voltage controlled oscillator (VCO) circuits. A VCO circuit is an electronic oscillator having an oscillation frequency controlled by a voltage. A VCO circuit can be used in function generators, phase-locked loop (PLL) circuits, frequency synthesizers, clock generators, and the like. An LC implementation of a VCO includes an inductor in parallel with a capacitor. An LC oscillator, also referred to as an LC tank, resonates when driven by an external source at a particular frequency referred to as the resonant frequency. It is desirable to configure an LC oscillator so that the resonant frequency has a wide tuning range. An LC oscillator with a wide tuning range can be used in more applications than an LC oscillator having a narrow tuning range.

SUMMARY

Techniques for providing an LC oscillator circuit with a wide tuning range are described. In one example, an oscillator circuit comprises: a master oscillator comprising a master LC tank coupled to a master active circuit, the master LC tank including a primary winding of a transformer and a capacitance; a slave oscillator comprising a slave LC tank coupled to a slave active circuit, the slave LC tank including a secondary winding of the transformer and a capacitance; and a first pair of coupling transistors and a second pair of coupling transistors each coupling the master oscillator to the slave oscillator. Gates of the first pair of coupling transistors are coupled to the master oscillator through a switch. Gates of the second pair of coupling transistors are coupled to the master oscillator through respective ninety-degree phase shifters and the switch.

In another example, an oscillator circuit comprises: an LC tank comprising an inductor in parallel with a capacitance; an active circuit coupled between the LC tank and a common node; and a pair of transistors coupling the LC tank to the common node. Gates of the pair of transistors are coupled to respective ends of the inductor through respective ninety-degree phase shifters.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
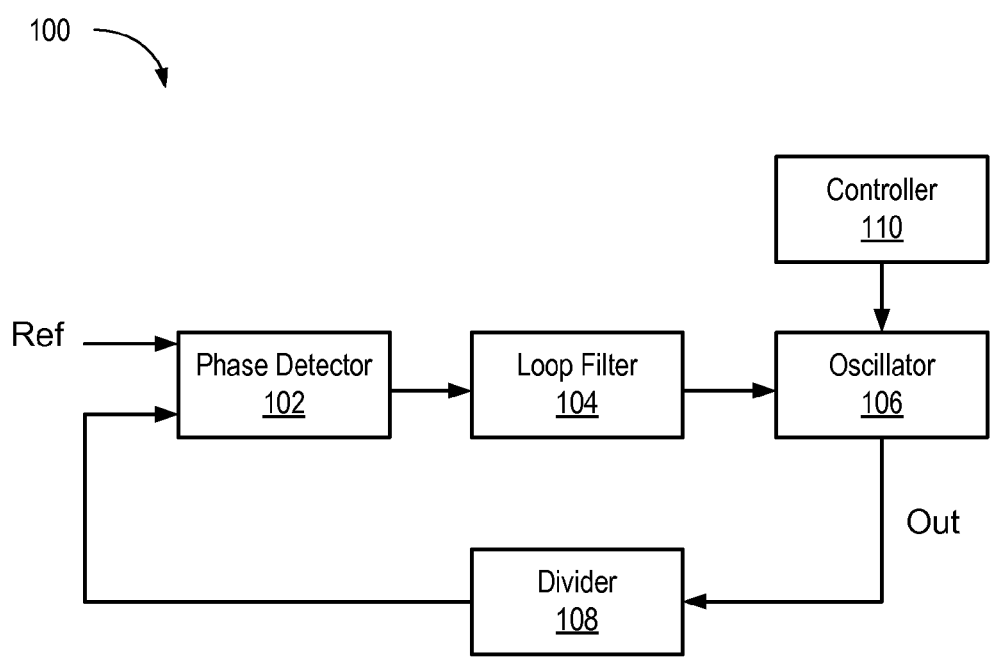
FIG. 1 is a block diagram depicting an example of a phase-locked loop (PLL) circuit that can use a wide tuning range LC oscillator as described herein.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated, or if not so explicitly described.

Techniques for providing an LC oscillator with a wide tuning range are described. In one example, an oscillator includes a master oscillator and a slave oscillator. The master oscillator includes a master LC tank coupled to a master active circuit, and the slave oscillator includes a slave LC tank coupled to a slave active circuit. The inductor in the master LC tank is a primary winding of a transformer, and the inductor in the slave LC tank is a secondary winding of the transformer. Two pairs of coupling transistors couple the master oscillator and the slave oscillator. Gates of the first pair of coupling transistors are coupled to the master oscillator through a switch. Gates of the second pair of coupling transistors are coupled to the master oscillator through respective ninety-degree phase shifters and the switch. The oscillator provides a wide tuning range by switching the current direction in the secondary winding of the transformer. The switch controls the direction of current in the secondary winding of the transformer, providing for a tunable high-frequency mode and a tunable low-frequency mode. The second pair of coupling transistors along with the ninety-degree phase shifters provide for fine frequency tuning by controlling the current in the secondary winding of the transformer.

In another example, an oscillator includes an LC tank coupled to an active circuit. A pair of transistors is coupled between the LC tank and a common node. Gates of the transistors are coupled to respective ends of the inductor through ninety-degree phase shifters. Fine frequency tuning is achieved by tuning injection current supplied by a current source coupled to a center tap of the inductor and consumed by the transistor pair. This avoids use of a varactor, which improves the quality factor of the LC tank.

FIG. 1 is a block diagram depicting an example of a phase-locked loop (PLL) circuit 100 that can use a wide tuning range LC oscillator as described herein. The PLL circuit 100 comprises a phase detector 102, a loop filter 104, an oscillator 106, and a divider 108. Inputs of the phase detector 102 receive a reference signal and output of the divider 108 (a feedback signal). The reference signal oscillates at a reference frequency. The phase detector 102 compares the reference signal and the feedback signal and produces an error signal that is proportional to the phase difference between such signals. The loop filter 104 filters the error signal (e.g., low-pass filtered). The filtered error signal is input to the oscillator 106. The oscillator 106 generates an oscillator signal (e.g., periodic signal) and adjusts the frequency of the oscillator signal based on the error signal. The oscillator signal is fed back to the divider 108, which divides the frequency of the oscillator signal for comparison with the reference signal (e.g., the frequency of the oscillator signal can be some multiple of the frequency of the reference signal). In some examples, the PLL circuit 100 can include a controller 110 that controls the oscillator 106 to select a particular oscillating frequency, as well as to provide coarse and fine tuning of the selected oscillating frequency.

To allow the PLL circuit 100 to be more flexible and capable of use in various applications, the oscillator 106 should have a wide tuning range. Wide tuning range LC oscillators can be designed using different techniques, such as (1) using a large capacitor bank; (2) putting a switch in the inductor; or (3) switching mutual inductance. Technique (1) suffers from the tradeoff between high-frequency noise and low-frequency power consumption. Technique (2) introduces a series resistance in the inductor path that degrades the quality factor (Q). Also, high switch parasitic capacitance reduces the oscillation frequency and tuning range. Technique (3) suffers from switch resistance and capacitances in the secondary inductor due to impedance transformation. For fine frequency tuning, LC oscillators typically employ a varactor (e.g., voltage-controlled capacitance). Varactor loss, however, significantly reduces the quality factor (Q) at higher frequencies. Also, a varactor requires a specific bias voltage and the gain of the LC oscillator is entirely decided by the voltage dependence of varactor capacitance. A wide tuning range LC oscillator that overcomes the aforementioned disadvantages is described below.

Figure 2:
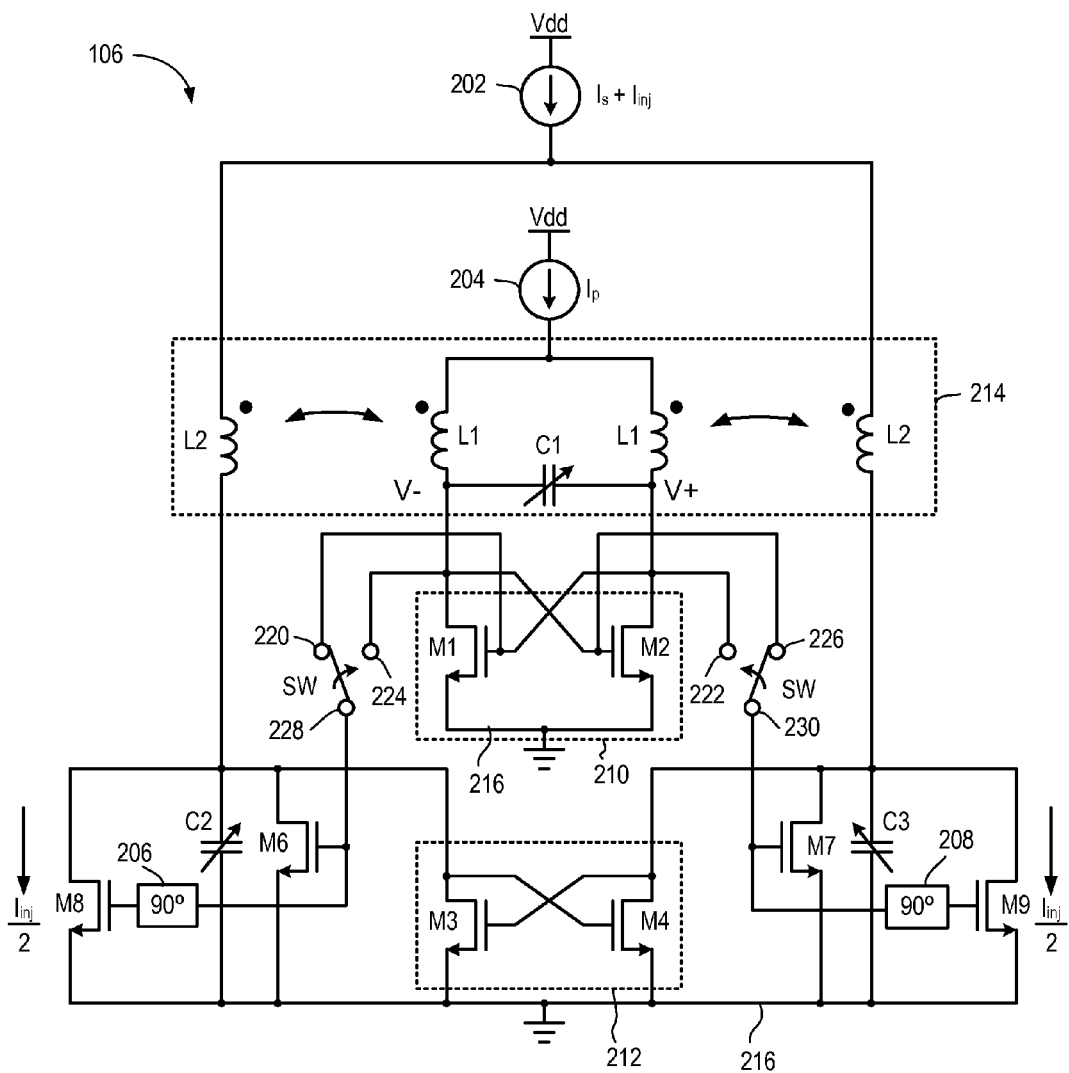
FIG. 2 is a schematic diagram showing an example of an oscillator.

FIG. 2 is a schematic diagram showing an example of the oscillator 106.

The oscillator 106 comprises a master oscillator and a slave oscillator. The master oscillator outputs a differential voltage signal (V). The master oscillator comprises an inductor L1, a capacitance C1, and an active circuit 210. The slave oscillator comprises an inductor L2, a capacitance C2 and C3, and an active circuit 212. The inductor L1 comprises a primary winding of a transformer 214. The inductor L2 comprises a secondary winding of the transformer 214. Thus, the inductors L1 and L2 are magnetically coupled providing a mutual inductance. The inductor L1 includes a center tap coupled to a current source 204. The current source 204 outputs a current ($I_p$) that is consumed by the master LC tank and the active circuit 210. The inductor L2 includes a center tap coupled to a current source 202. The current source 202 outputs a current ($I_s+I_{inj}$). The current ($I_s$) is consumed by the slave LC tank and the active circuit 212. The injection current ($I_{inj}$) is consumed by coupling transistors, as described below. The current sources 202 and 204 can include any type of current source known in the art. The current sources 202 and 204 are biased by a voltage (Vdd).

The inductor L1 and the capacitance C1 form an LC tank circuit ("master LC tank"). The inductor L2 and the capacitance C2 and C3 form an LC tank circuit ("slave LC tank"). In the example, the capacitance C1 comprises a switched-capacitor, and the capacitance C2 and C3 comprises switched-capacitors C2 and C3. The capacitance C1 is coupled in parallel with the inductor L1. The capacitance C2 is coupled between one end of the inductor L2 and a common node 216. The capacitance C3 is coupled between the other end of the inductor L2 and the common node 216. The common node 216 is coupled to a reference voltage, such as electrical ground.

The active circuit 210 comprises a circuit that provides a negative resistance in parallel with the inductor L1. The active circuit 210 compensates for losses in the master LC tank to sustain oscillation therein. In the example, the active circuit 210 comprises a pair of cross-coupled transistors M1 and M2. In the example, the transistors M1 and M2 comprise n-type metal oxide semiconductor (NMOS) transistors. Drains of the transistors M1 and M2 are coupled to respective ends of the inductor L1. Sources of the transistors M1 and M2 are coupled to the common node 216. A gate of the transistor M1 is coupled to the drain of the transistor M2, and a gate of the transistor M2 is coupled to a drain of the transistor M1. It is to be understood that the active circuit 210 can include other types of circuits to provide the appropriate negative resistance for compensating the master LC tank, such circuits being well-known in the art.

Similar to the active circuit 210, the active circuit 212 comprises a circuit that provides a negative resistance in parallel with the inductor L2. The active circuit 212 compensates for losses in the slave LC tank to sustain oscillation therein. In the example, the active circuit 212 comprises a pair of cross-coupled transistors M3 and M4. In the example, the transistors M3 and M4 comprise NMOS transistors. Drains of the transistors M3 and M4 are coupled to respective ends of the inductor L2. Sources of the transistors M3 and M4 are coupled to the common node 216. A gate of the transistor M3 is coupled to the drain of the transistor M4, and a gate of the transistor M4 is coupled to a drain of the transistor M3. It is to be understood that the active circuit 212 can include other types of circuits to provide the appropriate negative resistance for compensating the slave LC tank, such circuits being well-known in the art.

The oscillator 106 also includes a first pair of coupling transistors M6 and M7, and a second pair of coupling transistors M8 and M9. The coupling transistors M6-M9 couple the master oscillator and the slave oscillator. In the example, the coupling transistors M6-M9 comprise NMOS transistors. Drains of the coupling transistors M6 and M8 are coupled to one end of the inductor L2. Drains of the coupling transistors M7 and M9 are coupled to the other end of the inductor L2. Sources of the coupling transistors M6-M9 are coupled to the common node 216.

The oscillator 106 also includes a switch SW. In the example, the switch SW comprises a four-way switch having six terminals 220-230. Two terminals 220, 222 of the switch SW are coupled to one end of the inductor L1, and two other terminals 224, 226 of the switch SW are coupled to the other end of the inductor L1. The terminal 228 of the switch SW is coupled to a gate of the coupling transistor M6, and to a gate of the coupling transistor M8 through a ninety-degree phase shifter 206. The terminal 230 of the switch SW is coupled to a gate of the coupling transistor M7, and to a gate of the coupling transistor M9 through a ninety-degree phase shifter 208. The switch SW either couples the terminal pair 220, 226 to the terminal pair 228, 230, or the terminal pair 224, 222 to the terminal pair 228, 230. That is, the switch SW selectively couples one of two polarities of the output voltage (V) to the terminal pair 228, 230. In the example shown, the switch SW couples V− to the terminal 228, and V+ to the terminal 230. However, the switch SW can be controlled to couple V− to the terminal 230, and V+ to the terminal 228. The switch SW can be implemented using any type of switching device or circuit known in the art.

In operation, the direction of current flowing through the inductor L2 determines the effective inductance for oscillation. The direction of current in the inductor L2 is controlled using the switch SW. In one state, the switch SW causes the current in the inductor L2 to flow in the same direction as the current in the inductor L1 (the state shown by example in FIG. 2). In the other state, the switch SW causes the current in the inductor L2 to flow in the opposite direction as the current in the inductor L1. When current in inductors L1 and L2 flows in the same direction, the effective inductance is high and the oscillator 106 operates in a low-frequency mode. When current in inductors L1 and L2 flows in opposite directions, the effective inductance is low and the oscillator 106 operates in a high-frequency mode.

Coupling transistors M8-M9 are used for fine-frequency tuning. In the example shown, each of transistors M8 and M9 conducts half of the injection current ($I_{inj}$) provided by the current source 202. The ninety-degree phase shifters 206 and 208 keep the injection current ($I_{inj}$) phase-aligned with the current flowing in L2. In an example, the output signal (V) is a sinusoidal signal. In such case, the ninety-degree phase shifters 206 and 208 can be implemented using integrators. It is to be understood that any type of circuit capable of provide a ninety-degree phase shift that is known in the art can be used in the oscillator 106.

In this manner, the oscillator 106 provides a wide tuning range by switching the current direction in the secondary winding L2 of the transformer. The switch SW controls the direction of current in the secondary winding L2 of the transformer, providing for a tunable high-frequency mode and a tunable low-frequency mode. The second pair of coupling transistors M8-M9, along with the ninety-degree phase shifters 206 and 208, provide for fine frequency tuning by controlling the current in the secondary winding L2 of the transformer. The oscillator 106 does not require a large capacitor bank. The oscillator 106 does not require a switch in the inductor, which avoids insertion of a series resistance in the inductor path that would otherwise degrade the quality factor. The oscillator 106 achieves fine-frequency tuning without the use of a varactor, which improves the quality factor at higher frequencies, avoids the need for a specific bias voltage for the varactor, and eliminates gain dependence on a varactor.

Figure 3A:
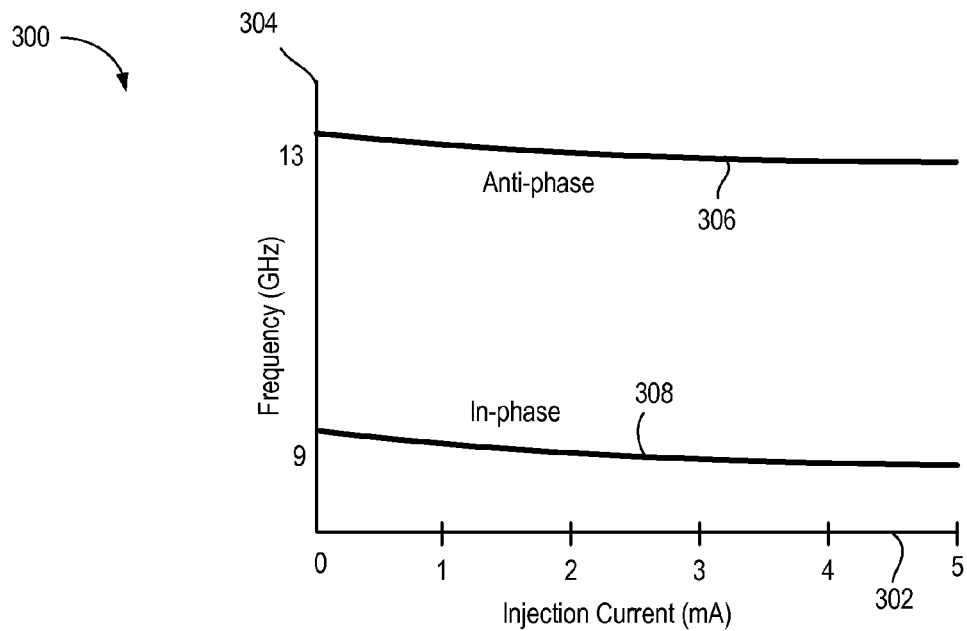
FIG. 3A is a graph depicting frequency versus injection current for the output of the oscillator shown in FIG. 2.

FIG. 3A is a graph 300 depicting frequency versus injection current for the output of the oscillator 106 shown in FIG. 2. The graph 300 includes an axis 302 that represents the injection current in milliamps (mA), and an axis 304 that represents frequency in gigahertz (GHz). A curve 306 represents the output of the oscillator 106 in the high-frequency mode (the current in L1 and L2 are in opposite directions or "anti-phase"), and a curve 308 represents the output of the oscillator 106 in the low-frequency mode (the current in L1 and L2 are in the same direction or "in-phase"). As shown, the output of the oscillator 106 (both in-phase and quadrature) can be fine-tuned around 13 GHz in the high-frequency mode or 9 GHz in the low-frequency mode. The specific frequencies are merely examples and can be different depending on the parameters L1, L2, C1, C2, and C3. As shown, the fine-tuning of the frequency in either the high-frequency or low-frequency mode is achieved by increasing or decreasing the injection current. As the injection current increases, the frequency of the output decreases. As the injection current decreases, the frequency of the output increases. In this manner, the frequency of the output of the oscillator 106 can be fine-tuned by supply more or less injection current ($I_{inj}$) to the slave oscillator. In addition to fine-frequency tuning, coarse-frequency tuning can be performed by adjusting the capacitance C1, C2, and C3.

As shown, the oscillator 106 provides a tunable high-frequency mode and a tunable low-frequency mode, depending on whether the current in L1 and L2 are in-phase or anti-phase. The capacitance of C1-C3 can be adjusted for coarse frequency tuning, while the injection current can be adjusted for fine-frequency tuning, in both of the high-frequency mode and the low-frequency mode.

Figure 3B:
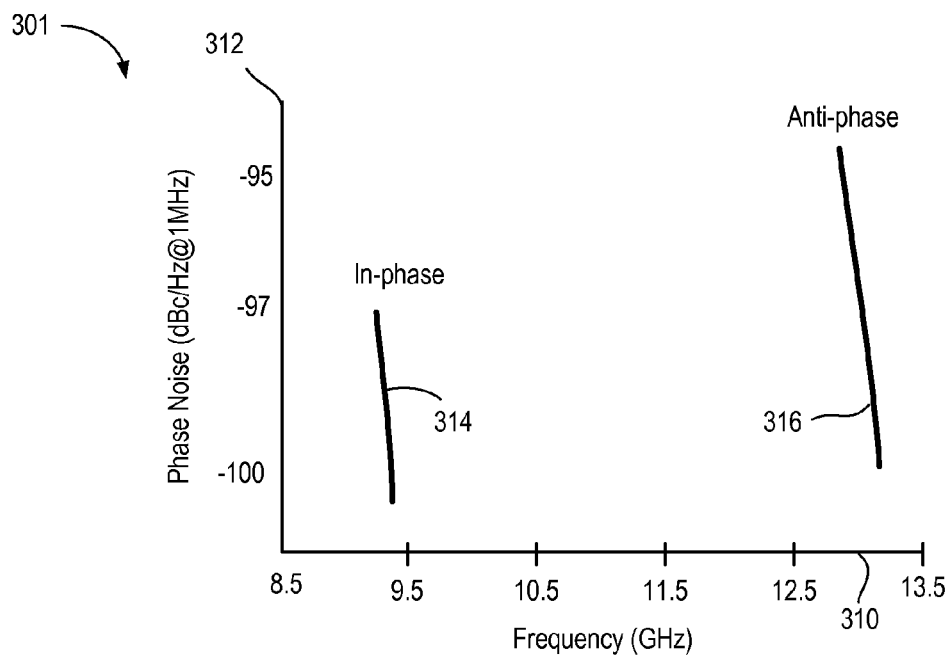
FIG. 3B is a graph depicting phase noise versus frequency for the oscillator shown in FIG. 2.

FIG. 3B is a graph 301 depicting phase noise versus frequency for the oscillator 106 shown in FIG. 2. The graph 301 includes an axis 310 that represents frequency in gigahertz (GHz), and an axis 312 that represents phase noise in decibels relative to the carrier per hertz at 1 megahertz (dBc/Hz @ 1 MHz). A curve 314 represents the phase noise for the low-frequency mode (in-phase current in the inductors L1 and L2), and a curve 316 represents the phase noise for the high-frequency mode (anti-phase current in the inductors L1 and L2). As the frequency increases, the phase noise decreases for each of the curves 314 and 316. As the frequency decreases, the phase noise increases for each of the curves 314 and 316.

Figure 4:
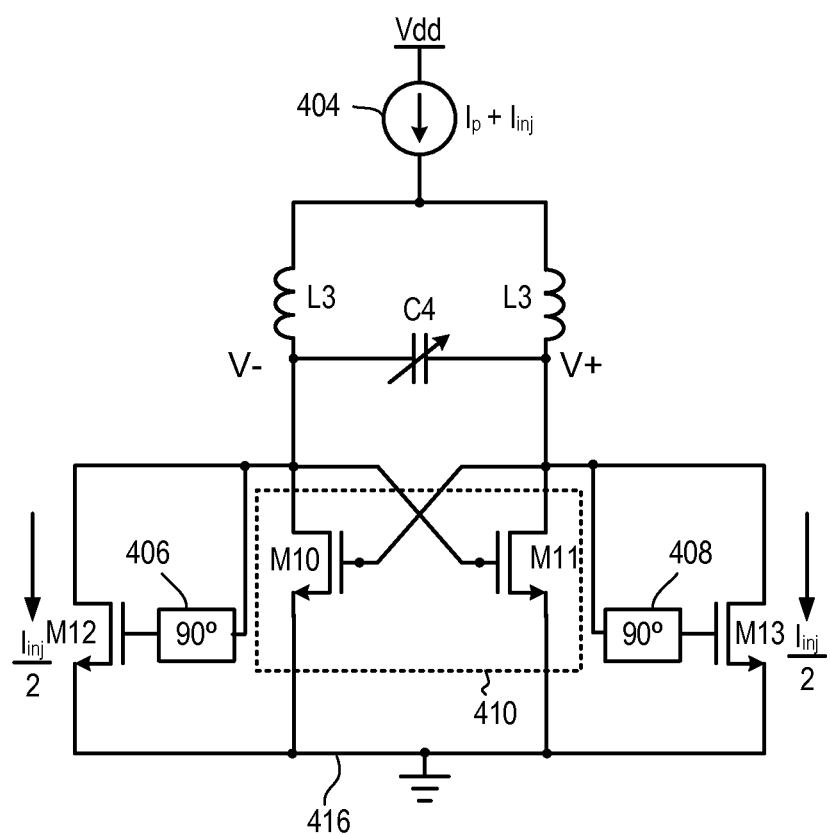
FIG. 4 is a schematic diagram showing another example of an oscillator.

FIG. 4 is a schematic diagram showing another example of the oscillator 106. The oscillator 106 as shown in FIG. 4 includes an LC tank comprising an inductor L3 in parallel with a capacitance C4. The capacitance C4 comprises a switched-capacitor in the present example. The LC tank is coupled in parallel with an active circuit 410. The active circuit 410 provides a negative resistance to compensate for losses in the LC tank. In the present example, the active circuit 410 comprises a cross-coupled pair of transistors M10 and M11. In the example shown, the transistors M10 and M11 comprise NMOS transistors. In other examples, other types of circuits can be used to provide negative resistance for compensating the LC tank as is known in the art. A center tap of the inductor L3 is coupled to a current source 404 that provides a current ($I_p+I_{inj}$). The current ($I_p$) is consumed by the LC tank and the active circuit 410. The injection current ($I_{inj}$) is consumed by additional transistors, as discussed below. The current source 404 is biased by a voltage (Vdd). The current source 404 can include any type of known current source. The output of the oscillator 106 shown in FIG. 4 is the voltage across the inductor L3, which is a differential voltage (V+ and V−).

The oscillator 106 shown in FIG. 4 further includes a pair of transistors M12 and M13. In the example, the transistors M12 and M13 comprise NMOS transistors. Drains of the transistors M12 and M13 are coupled to respective ends of the inductor L3. Sources of the transistors M12 and M13 are coupled to a common node 416. Gates of the transistors M12 and M13 are coupled to their drains through respective ninety-degree phase shifters 406 and 408.

In operation, transistors M12-M13 are used for fine-frequency tuning. In the example shown, each of transistors M12 and M13 conducts half of the injection current ($I_{inj}$) provided by the current source 402. The ninety-degree phase shifters 406 and 408 keep the injection current ($I_{inj}$) phase-aligned with the current flowing in L3. In an example, the output signal (V) is a sinusoidal signal. In such case, the ninety-degree phase shifters 406 and 408 can be implemented using integrators. It is to be understood that any type of circuit capable of provide a ninety-degree phase shift that is known in the art can be used in the oscillator 106.

In this manner, the oscillator 106 provides for fine frequency tuning by controlling the current in the inductor L3. The oscillator 106 does not require a large capacitor bank. The oscillator 106 does not require a switch in the inductor, which avoids insertion of a series resistance in the inductor path that would otherwise degrade the quality factor. The oscillator 106 achieves fine-frequency tuning without the use of a varactor, which improves the quality factor at higher frequencies, avoids the need for a specific bias voltage for the varactor, and eliminates gain dependence on a varactor.

Figure 5A:
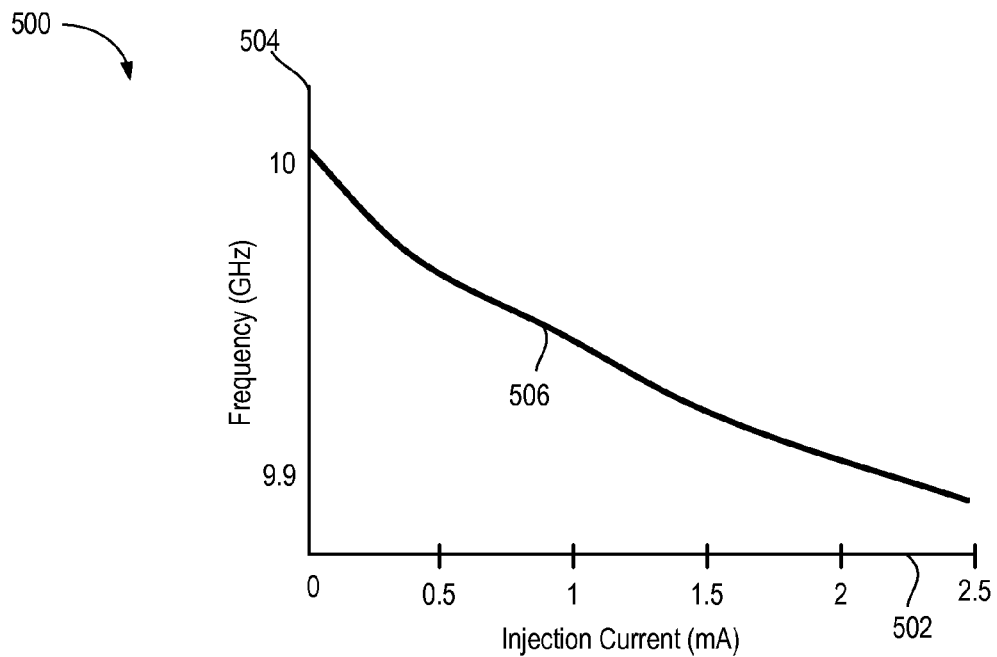
FIG. 5A is a graph depicting frequency versus injection current for the output of the oscillator shown in FIG. 4.

FIG. 5A is a graph 500 depicting frequency versus injection current for the output of the oscillator 106 shown in FIG. 4. The graph 500 includes an axis 502 that represents the injection current in milliamps (mA), and an axis 504 that represents frequency in gigahertz (GHz). A curve 506 represents the output of the oscillator 106. As shown, the output of the oscillator 106 can be fine-tuned around 10 GHz. The specific frequencies are merely examples and can be different depending on the parameters L1, L2, C1, C2, and C3. As shown, the fine-tuning of the frequency, in either the high-frequency or the low-frequency mode, is achieved by increasing or decreasing the injection current. As the injection current increases, the frequency of the output decreases. As the injection current decreases, the frequency of the output increases. In this manner, the frequency of the output of the oscillator 106 can be fine-tuned by supply more or less injection current ($I_{inj}$). The oscillator 106 achieves fine-frequency tuning without the use of a varactor, which improves the quality factor at higher frequencies, avoids the need for a specific bias voltage for the varactor, and eliminates gain dependence on a varactor.

Figure 5B:
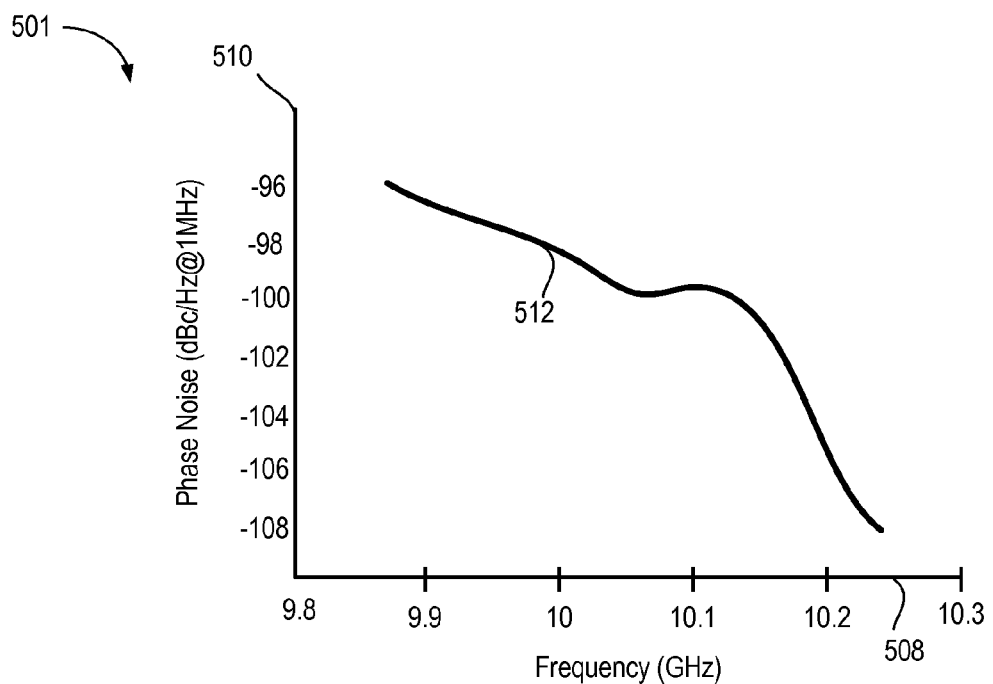
FIG. 5B is a graph depicting phase noise versus frequency for the oscillator shown in FIG. 4.

FIG. 5B is a graph 501 depicting phase noise versus frequency for the oscillator 106 shown in FIG. 4. The graph 501 includes an axis 508 that represents frequency in gigahertz (GHz), and an axis 510 that represents phase noise in decibels relative to the carrier per hertz at 1 megahertz (dBc/Hz @ 1 MHz). A curve 512 represents the phase noise for the oscillator output. As the frequency increases, the phase noise generally decreases. As the frequency decreases, the phase noise generally increases.

Figure 6:
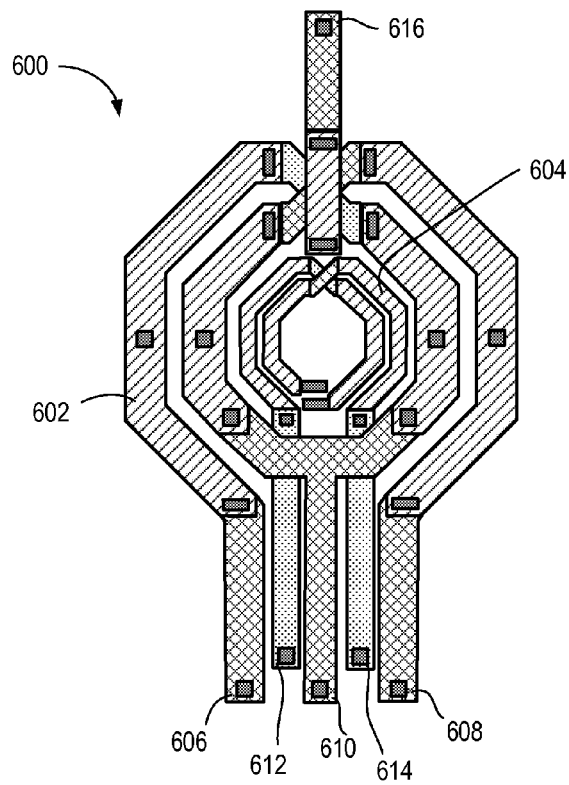
FIG. 6 shows a top-view of an example of a transformer that can be used in an oscillator described herein.

FIG. 6 shows a top-view of an example of a transformer 600 that can be used in the oscillator 106 described above. The transformer 600 can be formed on multiple conductive layers of an integrated circuit (IC). In the present example, the transformer 600 is formed using three conductive layers. The transformer 600 comprises a primary winding 602 and a secondary winding 604. The secondary winding 604 is concentric with the primary winding 602, where the secondary winding 604 is the inner winding and the primary winding 602 is the outer winding. The primary winding 602 includes terminal ports 606 and 608, as well as a center-tap port 610. The secondary winding 604 includes terminal ports 612 and 614, as well as a center-tap port 616.

Figure 7A:
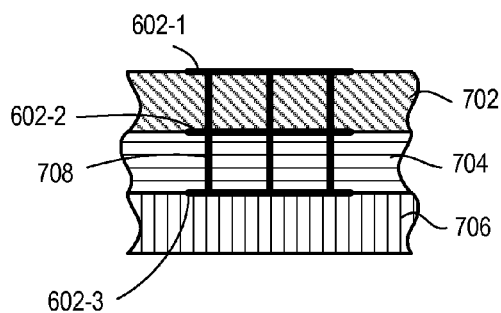
FIGS. 7A-7B show schematic cross-sections of primary and secondary windings, respectively, of a transformer.

The primary winding 602 is shown as having two turns, but in general can include any number of turns. FIG. 7A shows a schematic cross-section of the primary winding 602 formed on three layers 702, 704, and 706 of an IC. The primary winding 602 includes three portions 602-1, 602-2, and 602-3 connected in parallel by vias 708. FIG. 7A is a schematic and is not meant to show any specific physical layout of the primary winding 602. Connecting the three portions 602-1 through 602-3 of the primary winding 602 in parallel reduces inductance of the primary winding. In addition, the size of the primary winding 602, the number of turns of the primary winding 602, and the width of the conductive material of the primary winding 602 can vary depending on the desired inductance of the primary winding 602, the current requirements, and desired quality factor.

Figure 7B:
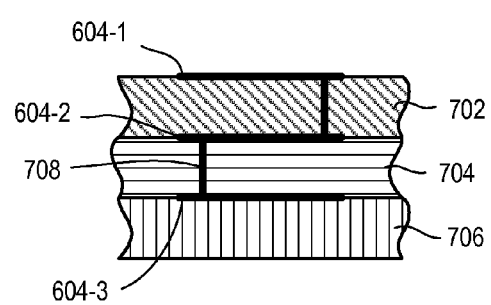

The secondary winding 604 can include, for example, three turns respectively formed on the three layers of the IC. FIG. 7B shows a schematic cross-section of the secondary winding 604 formed on the three layers 702 through 706 of the IC. The secondary winding 604 includes three portions 604-1, 604-2, and 604-3 connected in series by vias 708. FIG. 7B is a schematic and is not meant to show any specific physical layout of the secondary winding 604. Connecting the three portions 604-1 through 604-3 of the secondary winding 604 in series increases the inductance of the secondary winding. In addition, the size of the secondary winding 604, the number of turns of the secondary winding 604, and the width of the conductive material of the secondary winding 604 can vary depending on the desired inductance of the secondary winding 604, the current requirements, and desired quality factor. By varying such parameters, the inductance of the secondary winding can match the inductance of the primary winding. While three layers are shown by example, the transformer 600 can be formed on two or more layers. While the primary and secondary windings are shown with an example number of turns, the primary and secondary windings can be formed having more or less turns as desired.

Figure 8:
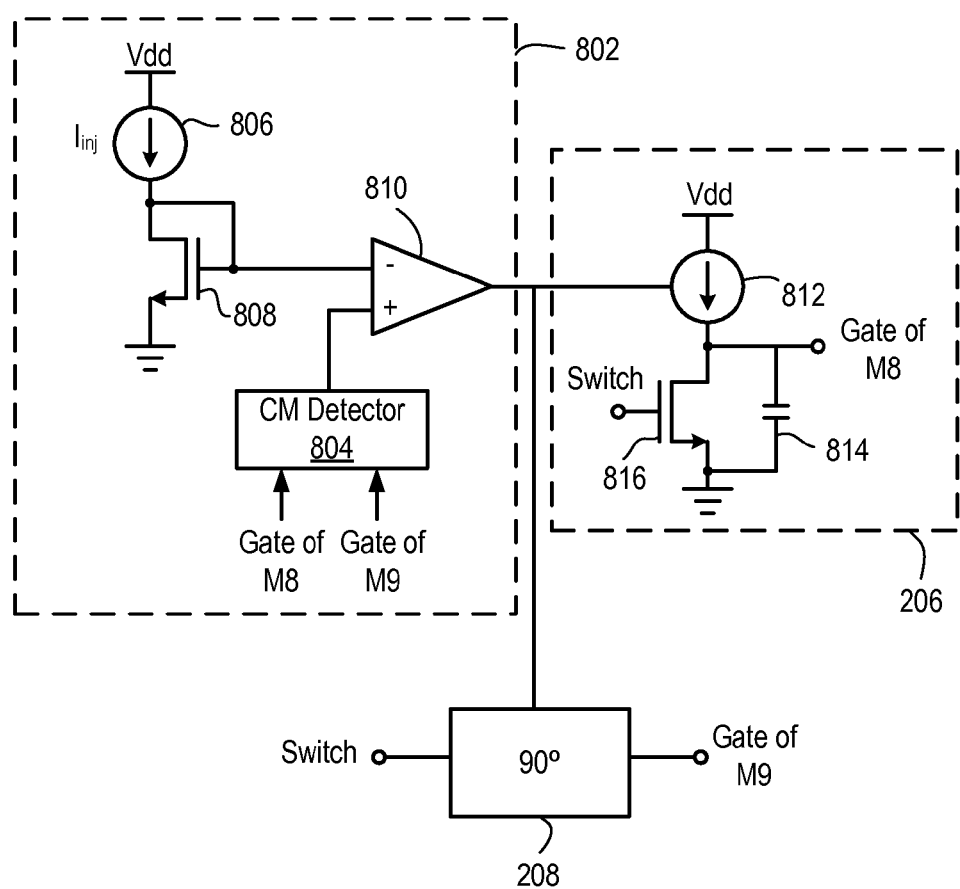
FIG. 8 is a schematic diagram showing an example of phase shift circuitry for the oscillator shown in FIG. 2.

FIG. 8 is a schematic diagram showing an example of phase shift circuitry for the oscillator 106 shown in FIG. 2. The ninety-degree phase shifters 206 and 208 are controlled by a common-mode feedback (CMFB) circuit 802. The CMFB circuit 802 comprises a current source 806, an N-channel transistor 808, a comparator 810, and a common-mode (CM) detector 804. A drain of the transistor 808 is coupled to a gate of the transistor 808. A source of the transistor 808 is coupled to a reference voltage (e.g., electrical ground). An inverting input of the comparator 810 is coupled to the gate of the transistor 808. A non-inverting input of the comparator 810 is coupled to an output of the CM detector 804. Inputs of the CM detector 804 are coupled to the gates of transistors M8 and M9.

FIG. 8 shows an example of the ninety-degree phase shifter 206. The ninety-degree phase shifter 208 can be constructed in similar fashion. The ninety-degree phase shifter 206 comprises a current source 812, an N-channel transistor 816, and a capacitor 814. A control input of the current source 812 is coupled to an output of the comparator 810. An output of the current source is coupled to a drain of the transistor 816. A source of the transistor 816 is coupled to the reference voltage (e.g., electrical ground). The capacitor 814 is coupled across the source and drain of the transistor 816. The drain of the transistor 816 is coupled to the gate of the transistor M8. A gate of the transistor 816 is coupled to the switch SW (terminal 230).

In operation, the ninety-degree phase shifters 206 and 208 comprise integrators. The CMFB circuit 802 controls the current source 812 in each of the ninety-degree phase shifters 206 and 208 to ensure that the additional tuning current ($I_{inj}$) flows only through the transistors M8 and M9 (e.g., half through M8 and half through M9).

Figure 9:
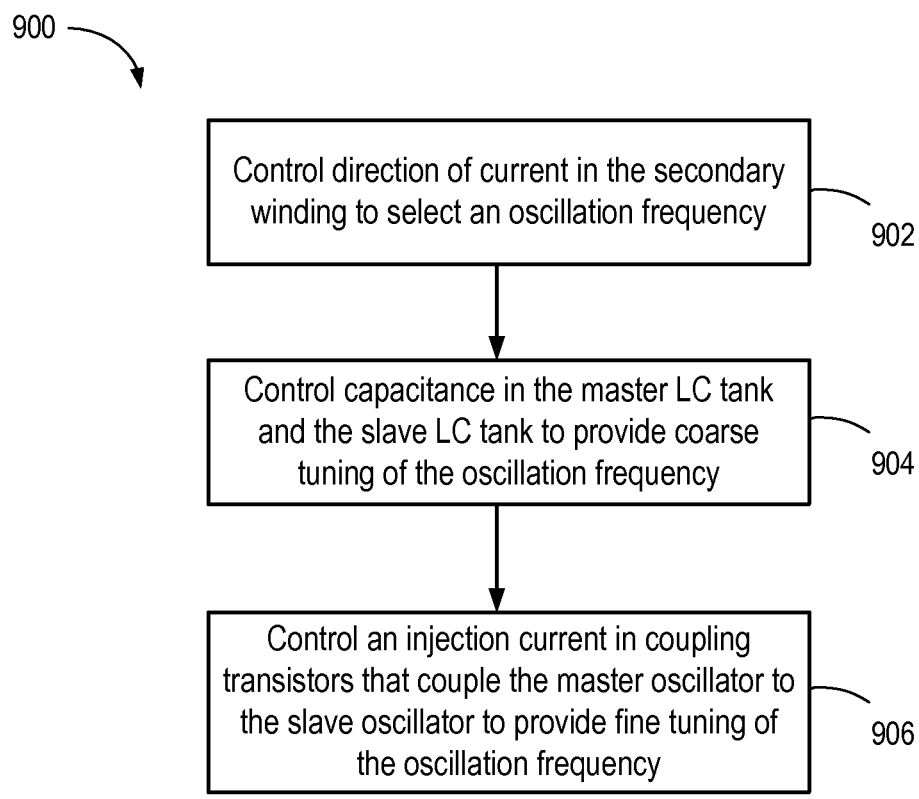
FIG. 9 is a flow diagram showing an example method of operating the oscillator shown in FIG. 2.

FIG. 9 is a flow diagram showing an example method 900 of operating the oscillator 106 shown in FIG. 2. The method 900 begins at step 900, where the direction of current in the secondary winding (L2) is controlled to select an oscillation frequency for the oscillator 106. For example, as shown in FIG. 3A, either an anti-phase frequency or an in-phase frequency can be selected by controlling the current to be in an opposite direction to the primary winding (L1) or in the same direction as the primary winding (L1). At step 904, capacitance in the master LC tank (C2) and capacitance in the slave LC tank (C2, C3) are controlled to provide coarse tuning of the oscillation frequency. At step 906, an injection current in coupling transistors (M8, M9) is adjusted to provide fine tuning of the oscillation frequency. Steps 902-906 can be performed by a controller coupled to the oscillator 106, such as the controller 110 shown in FIG. 1. For example, in step 902, the controller 110 can control the switch (SW) to switch the direction of the current in the secondary winding (L2) with respect to the current in the primary winding (L1). In step 904, the controller 110 can adjust the capacitance C1, the capacitance C2, the capacitance C3, or a combination thereof to provide coarse tuning of the oscillation frequency. In step 906, the controller 110 can control a current source to adjust an injection current (e.g., the current source 202 and/or the current source 806).

While the foregoing is directed to specific examples, other and further examples may be devised without departing from the basic scope thereof, and the scope thereof is determined by the claims that follow.

What is claimed is:

1. An oscillator circuit, comprising:
   a master oscillator comprising a master LC tank coupled to a master active circuit, the master LC tank including a primary winding of a transformer and a capacitance;
   a slave oscillator comprising a slave LC tank coupled to a slave active circuit, the slave LC tank including a secondary winding of the transformer and a capacitance; and
   a first pair of coupling transistors and a second pair of coupling transistors each coupling the master oscillator to the slave oscillator;
   wherein gates of the first pair of coupling transistors are coupled to the master oscillator through a switch; and
   wherein gates of the second pair of coupling transistors are coupled to the master oscillator through respective ninety-degree phase shifters and the switch.

2. The oscillator circuit of claim 1, wherein the primary winding of the transformer and the secondary winding of the transformer each include a center tap coupled to receive current from respective one of a master current source and a slave current source.

3. The oscillator circuit of claim 2, wherein the current supplied by the slave current source includes an injection current, and wherein half of the injection current is conducted through each transistor in the second pair of transistors.

4. The oscillator circuit of claim 3, wherein a frequency of a voltage across the primary winding is each dependent on the injection current.

5. The oscillator circuit of claim 1, wherein the master active circuit and the slave active circuit each comprise a pair of cross-coupled transistors.

6. The oscillator circuit of claim 1, wherein each of the first pair of coupling transistors and the second pair of coupling transistors includes drains coupled to the secondary winding and sources coupled to a common node.

7. The oscillator circuit of claim 1, wherein the switch comprises a four-way switch coupling respective ends of the primary winding to the gates of the first pair of coupling transistors and to the respective ninety-degree phase shifters coupled to the gates of the second pair of coupling transistors.

8. The oscillator circuit of claim 1, wherein the capacitance of the master LC tank comprises a switched-capacitor coupled between ends of the primary winding, and wherein the capacitance of the slave LC tank comprises a pair of switched-capacitors coupled between ends of the secondary winding and a common node.

9. The oscillator circuit of claim 1, wherein the first pair of coupling transistors, the second pair of coupling transistors, the master active circuit, and the slave active circuit include n-type metal oxide semiconductor (NMOS) transistors.

10. An oscillator circuit, comprising:
    an LC tank comprising an inductor in parallel with a capacitance between a pair of output nodes;
    an active circuit coupled to the pair of output nodes between the LC tank and a common node; and
    a pair of transistors coupled between the pair of output nodes and the common node;
    wherein gates of the pair of transistors are coupled to respective nodes of the pair of output nodes through respective ninety-degree phase shifters.

11. The oscillator circuit of claim 10, wherein the capacitance comprises a switched-capacitor.

12. The oscillator of claim 10, wherein the active circuit comprises a pair of cross-coupled transistors.

13. The oscillator of claim 10, wherein the pair of transistors includes drains coupled to the respective ends of the inductor and sources coupled to the common node.

14. The oscillator of claim 10, wherein the inductor includes a center tap coupled to receive a current from a current source.

15. The oscillator circuit of claim 14, wherein the current comprises an injection current, and wherein half of the injection current is conducted through each transistor in the pair of transistors.

16. The oscillator circuit of claim 15, wherein a frequency of voltage across the inductor is dependent on the injection current.

17. The oscillator circuit of claim 10, wherein the pair of transistors and the active circuit include n-type metal oxide semiconductor (NMOS) transistors.

18. A method of operating an oscillator circuit having a master oscillator comprising a master LC tank coupled to a master active circuit and a slave oscillator comprising a slave LC tank coupled to a slave active circuit, the master LC tank including a primary winding of a transformer and the slave LC tank including a secondary winding of a transformer, the method comprising:
    controlling direction of current in the secondary winding to select an oscillation frequency from an in-phase frequency and an anti-phase frequency;
    controlling capacitance in the master LC tank and the slave LC tank to provide coarse tuning of the oscillation frequency; and
    controlling an injection current in coupling transistors that couple the master oscillator to the slave oscillator to provide fine tuning of the oscillation frequency.

19. The method of claim 18, wherein the step of controlling direction of current in the secondary winding comprises:
    controlling a switch that couples the master oscillator and the slave oscillator through a first pair of coupling transistors to select an oscillation frequency from an in-phase frequency and an anti-phase frequency.

20. The method of claim 19, wherein coupling transistors comprise a second pair of coupling transistors having gates coupled to the master oscillator through respective ninety-degree phase shifters and the switch.

* * * * *